(12) United States Patent
West et al.

(10) Patent No.: US 11,532,693 B2
(45) Date of Patent: Dec. 20, 2022

(54) PASSIVE COMPONENTS WITH IMPROVED CHARACTERISTICS

(71) Applicant: TEXAS INSTRUMENTS INCORPORATED, Dallas, TX (US)

(72) Inventors: Jeffrey Alan West, Dallas, TX (US); Byron Lovell Williams, Plano, TX (US); Elizabeth Costner Stewart, Dallas, TX (US); Thomas Dyer Bonifeld, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/152,230

(22) Filed: Jan. 19, 2021

(65) Prior Publication Data
US 2022/0231115 A1 Jul. 21, 2022

(51) Int. Cl.
*H01L 23/552* (2006.01)
*H01L 23/49* (2006.01)
*H01L 23/522* (2006.01)
*H01L 49/02* (2006.01)

(52) U.S. Cl.
CPC .......... *H01L 28/10* (2013.01); *H01L 23/552* (2013.01); *H01L 28/60* (2013.01); *H01L 23/49* (2013.01)

(58) Field of Classification Search
CPC .................. H01L 28/60; H01L 28/10
See application file for complete search history.

(56) References Cited

U.S. PATENT DOCUMENTS

| | | | |
|---|---|---|---|
| 7,046,113 B1* | 5/2006 | Okamoto | H01L 23/5227 336/200 |
| 2015/0115407 A1* | 4/2015 | Tao | H01L 28/60 257/532 |
| 2017/0005046 A1* | 1/2017 | Sin | H01L 28/10 |
| 2017/0069710 A1* | 3/2017 | Che | H01L 28/60 |
| 2017/0098604 A1* | 4/2017 | Ho | H01L 23/5223 |

* cited by examiner

*Primary Examiner* — Omar F Mojaddedi
(74) *Attorney, Agent, or Firm* — Jacqueline J. Garner; Frank D. Cimino

(57) ABSTRACT

Described examples include a hybrid circuit having a component. The component has a first conductive element on a substrate having a configuration and having a first periphery and having an extension at the first periphery. The component also has a dielectric on the first conductive element. The component also has a second conductive element having the configuration on the dielectric that is proximate to and aligned with the first conductive element, and has a second periphery, the extension of the first conductive element extending past the second periphery.

14 Claims, 16 Drawing Sheets

PASSIVE COMPONENTS WITH IMPROVED CHARACTERISTICS

TECHNICAL FIELD

This relates generally to components for high voltage environments, and in more particular to examples, to passive components with improved characteristics.

BACKGROUND

Circuit designers use integrated and hybrid devices in some very harsh environments. For example, some industrial applications require devices to withstand voltages of 600V or more. The small size of integrated devices and hybrid devices makes them vulnerable to damage from such high voltages. This vulnerability occurs even if the devices themselves are not operating at high voltages. Stray voltage spikes and strong fields can cause damage.

One way of addressing these problems is the use of galvanic isolation. In galvanic isolation one integrated or hybrid circuit communicates with another through a transformer or a capacitor. The circuits communicate by altering the current through the transformer or the voltage on a capacitor. In some applications, a transmitting circuit applies a carrier frequency that is encoded with a digital signal, which the receiving circuit then decodes. Because there is no conductive connection between the circuits, stray voltage spikes in one circuit are not conducted to the other circuit.

In some hybrid devices, integrated circuits use galvanic isolation using solid state transformers or capacitors. Sometimes the transformer or capacitor is formed on one of the integrated circuits. Even with a separate passive device, voltage spikes can be transmitted through one of the circuits to the passive device. In addition, in the harsh environments where these circuits are employed, strong electric fields from outside of the circuits can occur. Even if the passive component does not break down, exposure to high fields can alter characteristics of a dielectric in a transformer or capacitor. This can make the dielectric more susceptible to breakdown under a subsequent high field or can alter the electrical parameters of the passive device to the point where the connected circuits can no longer reliably communicate. Therefore, it is desirable to mitigate the effects of high electric fields on the passive components.

SUMMARY

In accordance with an example, a hybrid circuit including a component. The component having a first conductive element on a substrate having a configuration and having a first periphery and having an extension at the first periphery. The component also having a dielectric on the first conductive element. The component also having a second conductive element having the configuration on the dielectric that is proximate to and aligned with the first conductive element, and having a second periphery, the extension of the first conductive element extending past the second periphery.

DETAILED DESCRIPTION

Figure 1:
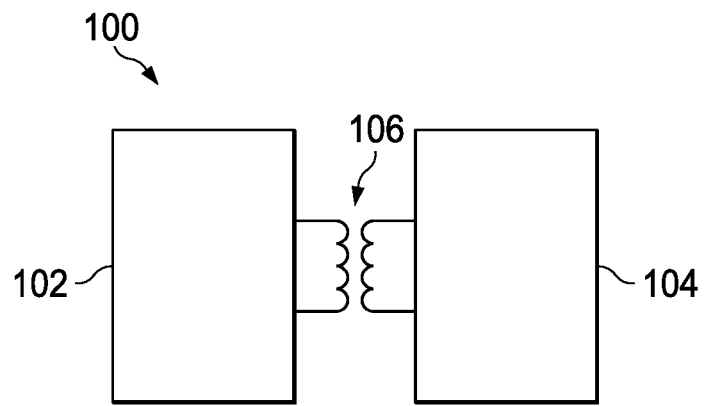
FIG. 1 is a schematic diagram of an example circuit.

In the drawings, corresponding numerals and symbols generally refer to corresponding parts unless otherwise indicated. The drawings are not necessarily drawn to scale.

In this description, the term "coupled" may include connections made with intervening elements, and additional elements and various connections may exist between any elements that are "coupled." Also, in this description, the terms "on" and "over" may include layers or other elements where intervening or additional elements are between an element and the element that it is "on" or "over." The term "directly on" with respect a first layer over a second layer means the first layer touches the second layer.

In example arrangements, the problem of localized high electric fields in passive components is solved by extending one portion of the passive component beyond the other portion of the passive component at the periphery of the passive component to mitigate concentration of fields at the periphery of the passive component. In an example, a hybrid circuit includes a component. The component having a first conductive element on a substrate having a configuration and having a first periphery and having an extension at the first periphery. The component also having a dielectric on the first conductive element. The component also having a second conductive element having the configuration on the dielectric that is proximate to and aligned with the first conductive element, and having a second periphery, the extension of the first conductive element extending past the second periphery.

FIG. 1 is a schematic diagram of an example circuit 100. Circuit 100 includes galvanic isolation between first circuit 102 and second circuit 104. First circuit 102 couples to one coil of transformer 106. Second circuit 104 couples to the other coil of transformer 106. Transformer 106 allows first circuit 102 to communicate with second circuit 104 without a conductive connection between the two circuits. For example, a signal that changes from first circuit 102 can be detected on the coil coupled to second circuit 104. In an example, first circuit 102 uses a carrier frequency. First circuit encodes the carrier frequency with pulse code modulation (PCM), phase shift keying (PSK), or another technique for encoding data on a carrier frequency. Second circuit 104 receives and decodes the encoded carrier frequency, and thus receives the information transmitted from first circuit 102.

Figure 2:
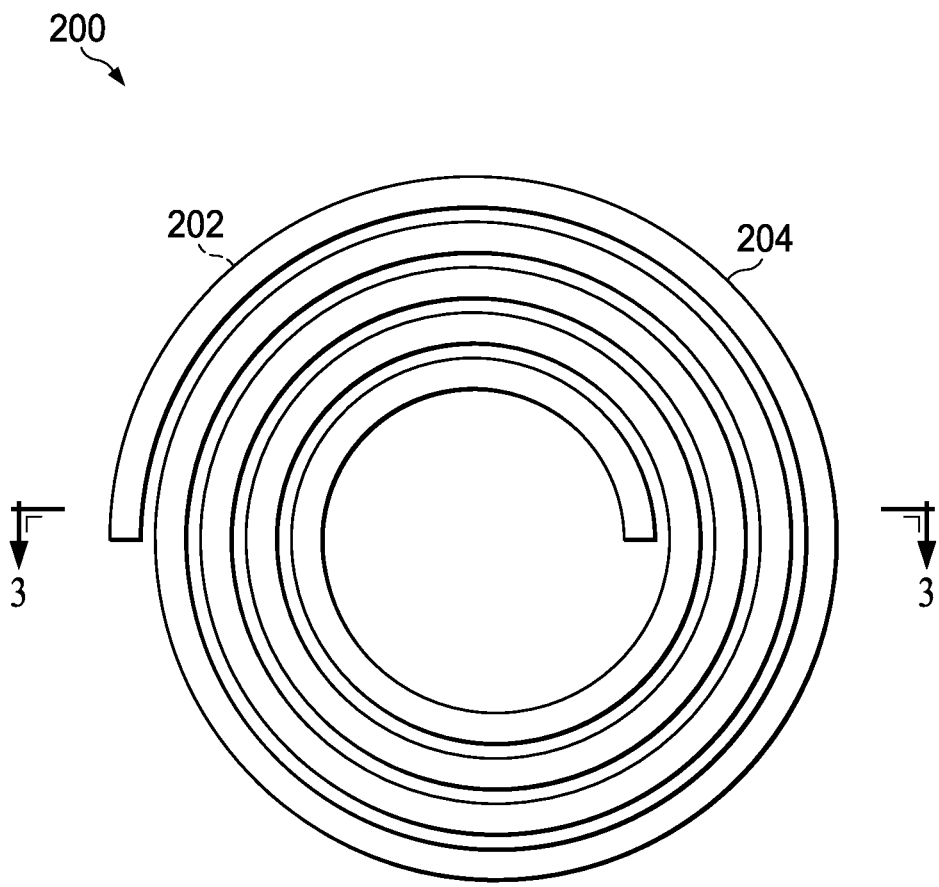
FIG. 2 is a view of an example transformer.
Figure 3:
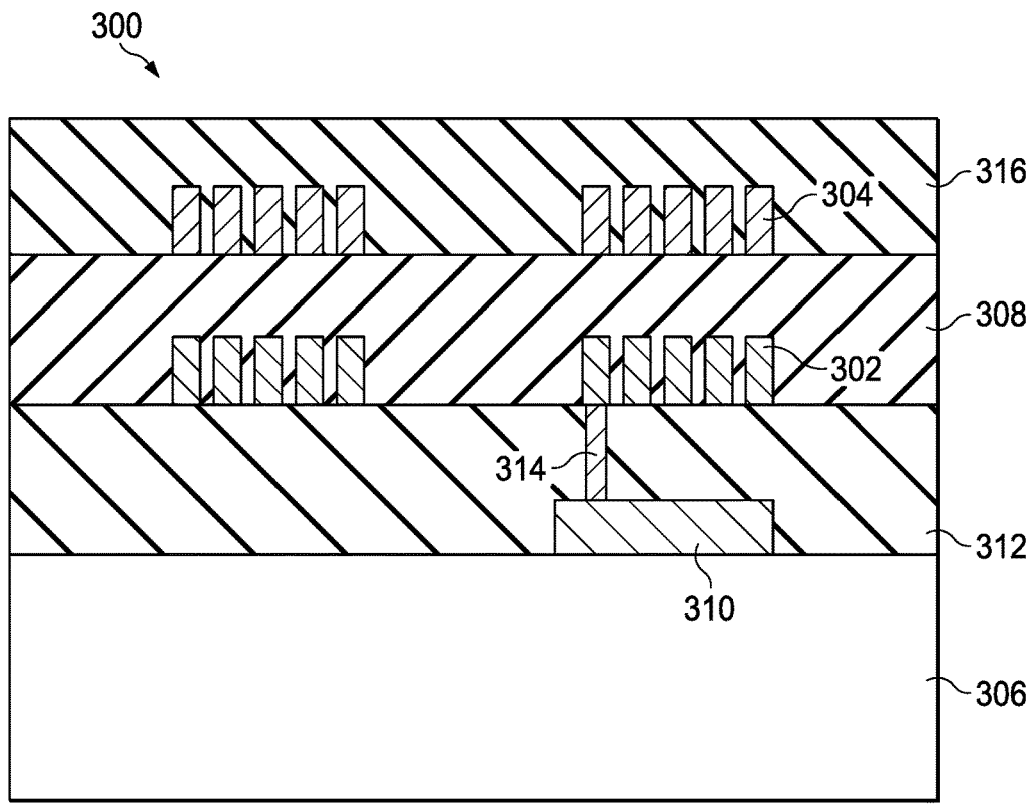
FIG. 3 is a view of an example transformer that is perpendicular to the view of FIG. 2.

FIG. 2 is a view of an example transformer 200. In this perspective, second coil 204 covers a matching first coil 202. FIG. 3 is a view of example transformer 300 that is perpendicular to the view of FIG. 2. Transformer 300 is an example of transformer 200 (FIG. 2). Second coil 304 is an example of second coil 204 (FIG. 2) and first coil 302 is an example of first coil 202 (FIG. 2). In the example of transformer 300, a first level metal 310 is on a substrate 306. In this example, substrate 306 includes a top insulating layer, such as an oxide layer, on a crystalline semiconductor layer so that first level metal layer is on an insulating substrate. Also, in this example, first level metal 310 is an aluminum layer with titanium nitride sticking layers on the surface that contacts substrate 306 and on the opposite surface of first level metal 310. In other examples, first level metal is copper, gold or another conductor. Photolithography patterns first level metal 310. First interlevel dielectric 312 is a combination of high-density plasma (HDP) chemical vapor deposition and plasma-enhanced chemical vapor deposited (PECVD) oxide layer formed over first level metal 310 and substrate 306. Photolithography forms an opening in first interlevel dielectric 312. A conductive material such as titanium, titanium nitride, tungsten or alloys thereof fills the opening to form via 314. A second level metal deposited on first interlevel dielectric 312 forms first coil 302. Via 314 contacts one end of first coil 302 and first level metal 310 provides a conductive connection from a bond pad (not shown) to via 314. Another portion of first level metal 310 and another via (not shown) provides contact to the other end of first coil 302. In this example, first coil 302 is aluminum with titanium nitride sticking layers on the surface where first coil 302 contacts first interlevel dielectric 312 and on the opposing surface of first coil 302.

Second interlevel dielectric 308 is a combination of HDP oxide and PECVD tetraethyl orthosilicate (TEOS) oxide formed on first coil 302 and first interlevel dielectric 312. A third level metal patterned using photolithography forms second coil 304 on second interlevel dielectric 308. The third level metal includes bond pads (not shown) that provide connection to either end of second coil 304. In this example, second coil 304 is aluminum with titanium nitride sticking layers on the surface where second coil 304 contacts second interlevel dielectric 308 and on the opposing surface of second coil 304. Protective overcoat (PO) layer 316 covers second coil 304. A varying signal from a circuit such as first circuit 102 (FIG. 1) on, for example, second coil 304 induces a signal on first coil 302. This signal can then be decoded by a circuit such as second circuit 104 (FIG. 1) that is connected to first coil 302. In another example, second coil 304 and first coil 302 are plates and the signal passes from a circuit connected to second coil 304 to first coil 302 by capacitive coupling.

Figure 4:
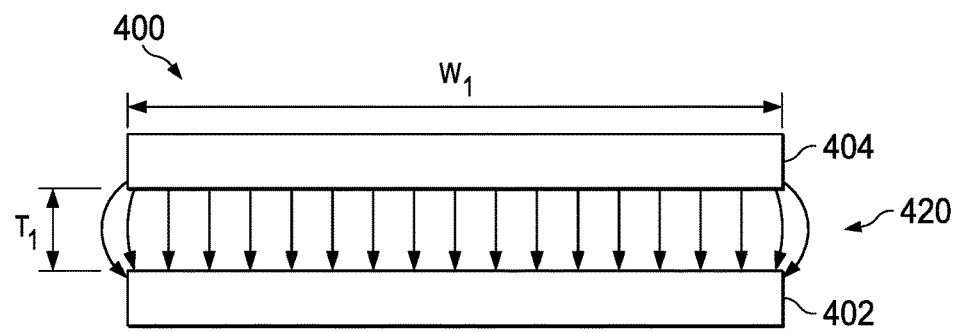
FIG. 4 is a side view of an example transformer.

FIG. 4 is a side view of an example transformer 400. Second coil 404 is an example of second coil 304. First coil 402 is an example of first coil 302. Electric field lines 420 form between second coil 404 and first coil 402 when one of the circuits attached to second coil 404 or first coil 402 applies a voltage pulse or other aberration to the coils. In addition, in some environments, such as industrial or automotive environments, external elements create strong fields. Under this condition, second coil 404 and first coil 402 behave like capacitor plates, and thus are shown as solid plates to show the effects of the field applied to second coil 404 and first coil 402. In the example of transformer 400, second coil 404 and first coil 402 are close enough together so that most of the field is between second coil 404 and first coil 402, and little of the field concentrates at the edges of second coil 404 and first coil 402. The behavior of transformer 400 in the context of applied electric field is dependent on the width of the coils versus the thickness of the dielectric between the coils. In this example, second coil 404 and first coil 402 are greater than 100 µm wide ($W_1$) and the dielectric between second coil 404 and first coil 402 is less than 1 µm thick ($T_1$). However, a thin dielectric as in this example is subject to breakdown in harsh environments.

Figure 5:
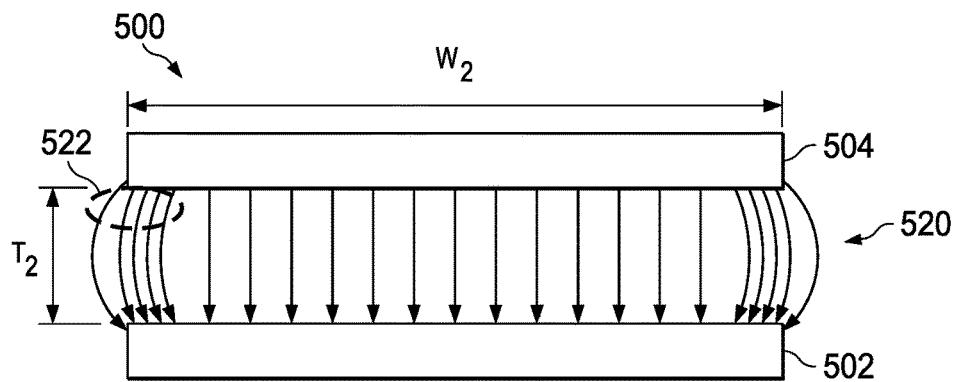
FIG. 5 is a side view of an example transformer.

FIG. 5 is a side view of an example transformer 500. Second coil 504 is an example of second coil 304 (FIG. 3). First coil 502 is an example of first coil 302 (FIG. 3). Transformer 500 is configured for a harsh environment that may include strong electric fields. Under this condition second coil 504 and first coil 502 behave like capacitor plates, and thus are shown as solid plates to show the effects of the field applied to second coil 504 and first coil 502. In this example, the width $W_2$ of second coil 504 and first coil 502 is similar to $W_1$ of transformer 400 (FIG. 4). However, the thickness of the dielectric between second coil 504 and first coil 502 $T_2$ is approximately 18.5 µm, which is much greater $T_1$ of transformer 400 (FIG. 4). The greater the distance between second coil 504 and first coil 502, the more the two coils behave less like plates, as shown in FIG. 4, and more like point sources at the periphery. The result is that more of field 520 concentrates at the periphery of second coil 504 and first coil 502 as strong field 522. Although not shown in FIG. 5, in practical examples, a dielectric layer separates second plate 504 and first plate 502. An example of such a dielectric layer is second interlevel dielectric 308 (FIG. 3). Because the distance $T_2$ is large, the dielectric in strong field 522 is less likely to break down immediately. However, over time, strong field 522 can change the properties of the dielectric such that breakdown is more likely. In addition, the changes in the properties of the dielectric may affect the electrical performance of transformer 500, which may lead to a failure of a circuit including transformer 500. For example, to transmit a signal from one circuit, such as first circuit 102 (FIG. 1), to another circuit, such as second circuit 104 (FIG. 1), via transformer 106 (FIG. 1), a carrier frequency tuned to a resonant frequency of the circuit is most efficient for transmission of the carrier signal. If the physical characteristics of the dielectric in the transformer change, the inductance of the transformer may shift, thus shifting the resonant frequency of the circuit. Because the carrier is no longer at the resonant frequency, the efficiency of transmission of the signal lowers, which may lower the received signal to the point where second circuit 104 (FIG. 1) can no longer decode the signal.

Figure 6:
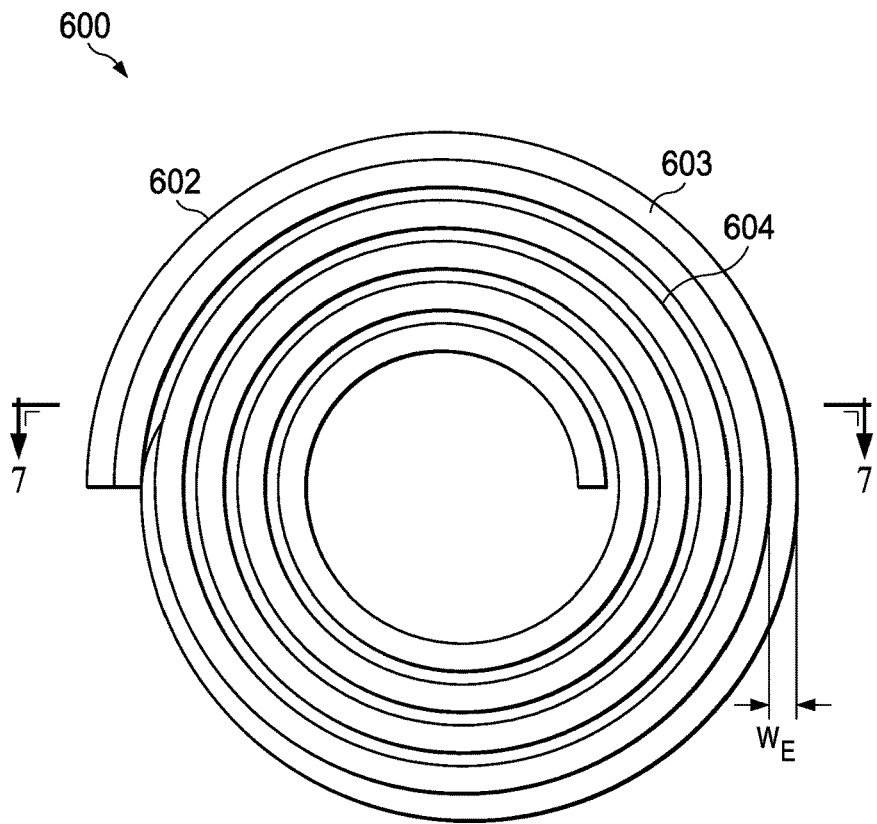
FIG. 6 is a view of an example transformer.

FIG. 6 is a view of an example transformer 600. The view of FIG. 6 is like the view of FIG. 2. First coil 602 matches second coil 604 except the outer periphery of first coil 602 includes an extension 603 with a width $W_E$ so that, in the outer loop of first coil 602, first coil 602 is wider than the outer loop of second coil 604. A varying signal from a circuit such as first circuit 102 (FIG. 1) on, for example, second coil 604 induces a signal on first coil 602. This signal can then be decoded by a circuit such as second circuit 104 (FIG. 1) that is connected to first coil 602.

Figure 7:
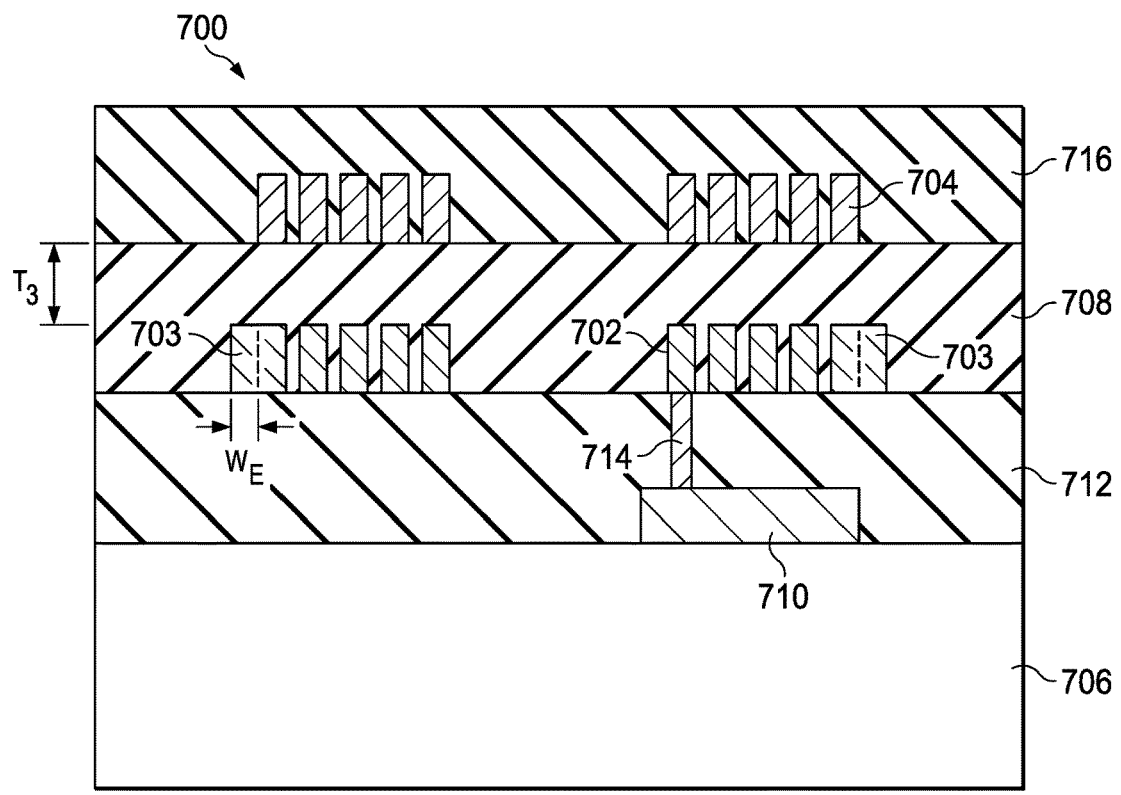
FIG. 7 is a view of example transformer that is perpendicular to the view of FIG. 6.

FIG. 7 is a view of example transformer 700 that is perpendicular to the view of FIG. 6. Transformer 700 is an example of transformer 600 (FIG. 6). In the example of transformer 700, a first level metal 710 is on a substrate 706. In this example, substrate 706 includes a top insulating layer, such as an oxide layer, on a crystalline semiconductor layer so that first level metal layer is on an insulating substrate. Also, in this example, first level metal 710 is an aluminum layer with titanium nitride sticking layers on the surface that contacts substrate 706 and on the opposite surface of first level metal 710. In other examples, first level metal is copper, gold or another conductor. Photolithography patterns first level metal 710. In this example, first interlevel dielectric 712 is a plasma-enhanced chemical vapor deposited (PECVD) oxide layer formed over first level metal 710 and substrate 706. In other examples, first interlevel dielectric is other forms of silicon dioxide, such as tetraethyl orthosilicate (TEOS), or other dielectric materials, such as silicon nitride. Photolithography forms an opening in first interlevel dielectric 712. In this example, a conductive material such as titanium, titanium nitride, tungsten or alloys thereof fills the opening to form via 714. Other examples use other conductive materials. A second level metal deposited on first interlevel dielectric 712 forms first coil 702. Via 714 contacts one end of first coil 702 and first level metal 710 provides a conductive connection from a bond pad (not shown) to via 714. Another portion of first level metal 710 and another via (not shown) provides contact to the other end of first coil 702. In this example, first coil 702 is aluminum with titanium nitride sticking layers on the surface where first coil 702 contacts first interlevel dielectric 712 and on the opposing surface of first coil 702. In other examples, first coil 702 is other conductive materials, such as copper.

In this example, second interlevel dielectric 708 is PECVD oxide formed on first coil 702 and first interlevel dielectric 712. In other examples, second interlevel dielectric 708 is other forms of silicon dioxide, such as TEOS, or other dielectric materials, such as silicon oxy-nitride. A third level metal patterned using photolithography forms second coil 704 on second interlevel dielectric 708. The third level metal includes bond pads (not shown) that provide connection to either end of second coil 704. In this example, second coil 704 is aluminum with titanium nitride sticking layers on the surface where second coil 704 contacts second interlevel dielectric 708 and on the opposing surface of second coil 704. In other examples, second coil 704 is other conductor materials, such as copper. Protective overcoat (PO) layer 716 covers second coil 704. In this example, PO layer 716 is a silicon dioxide/silicon nitride bilayer.

Figure 8:
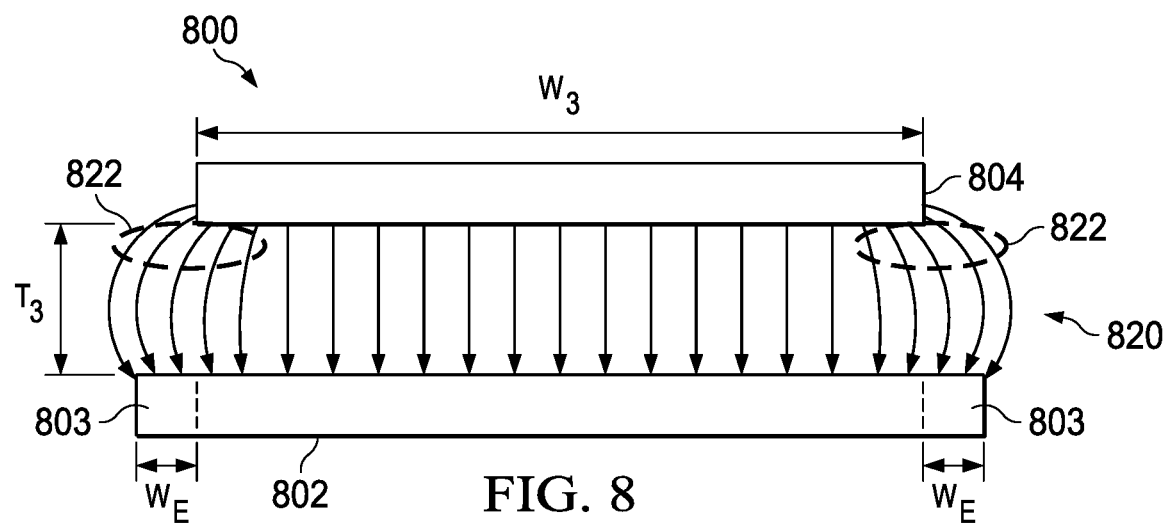
FIG. 8 is a view of an example transformer.

FIG. 8 is a view of an example transformer 800. Second coil 804 is an example of second coil 704 (FIG. 7). First coil 802 is an example of first coil 702 (FIG. 7). FIG. 8 shows an electric field 820 applied between second coil 804 and first coil 802 by an external source or a surge from the circuits coupled to transformer 800. Under this condition second coil 804 and first coil 802 behave like capacitor plates, and thus are shown as solid plates to show the effects of electric field 820 applied to second coil 804 and first coil 802. In this example, second coil 804 and first coil 802 are greater than 100 µm wide ($W_3$) and the dielectric between second coil 804 and first coil 802 is greater than 18.5 µm thick ($T_3$). In other examples, the dielectric between second coil 804 and first coil 802 is between 5 and 30 µm thick. Therefore, as with example transformer 500 (FIG. 5), second coil 804 and first coil 802 behave like point sources with regard to electric field 820 at the periphery of second coil 804 and first coil 802. However, in this example, first coil 802 includes extension 803 at its periphery. Extension 803 spreads electric field 820 so that the intensity of field 822 at any point is less than field 522 (FIG. 5). Thus, the electric field applied to a dielectric between second coil 804 and first coil 802, such as second interlevel dielectric 708 (FIG. 7), is diminished and is less likely to cause damage to the dielectric. In this example, width $W_E$ of extension 803 is about 6.25 µm, which is at least 10% of the thickness $T_3$ between second coil 804 and first coil 802. This relationship provides most of the potential field reducing benefit of including extension 803.

Figure 9:
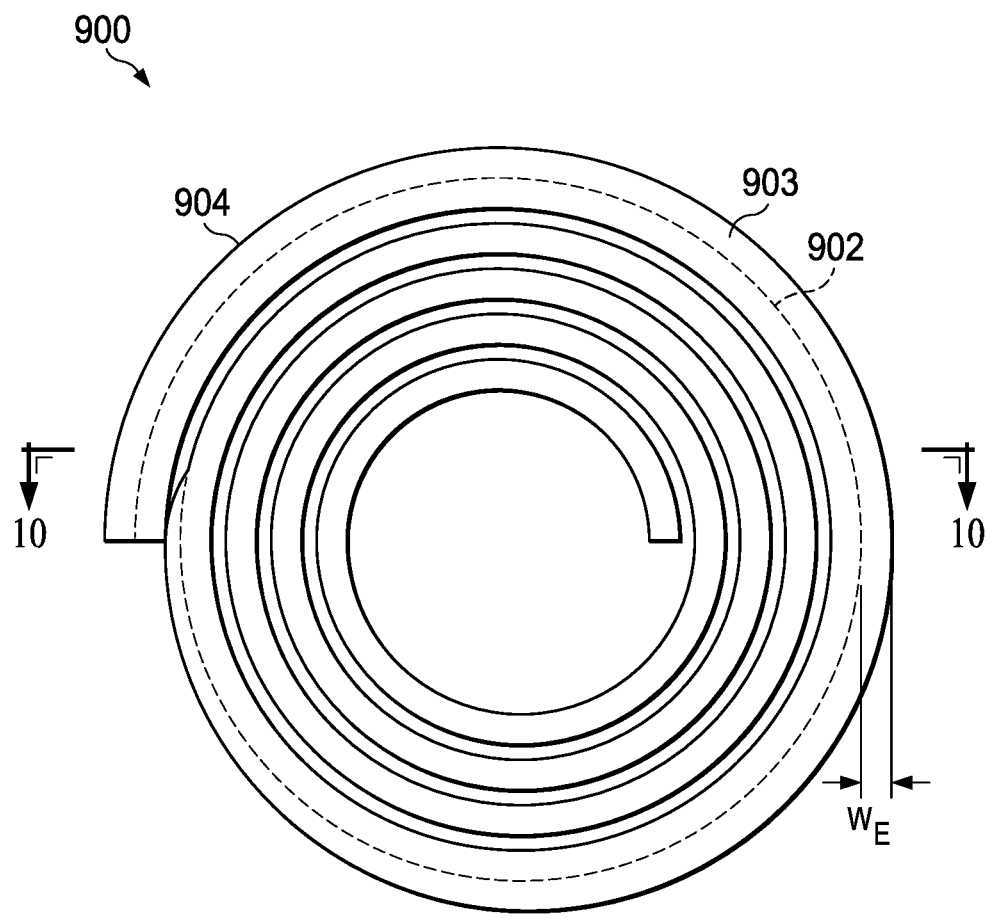
FIG. 9 is a view of an example transformer.

FIG. 9 is a view of an example transformer 900. The view of FIG. 9 is like the view of FIG. 2. First coil 902 matches second coil 904 except the outer periphery of second coil 904 includes an extension 903 with a width $W_E$ so that, in the outer loop of second coil 904, second coil 904 is wider than the outer loop of first coil 902. A varying signal from a circuit such as first circuit 102 (FIG. 1) on, for example, second coil 904 induces a signal on first coil 902. This signal can then be decoded by a circuit such as second circuit 104 (FIG. 1) that is connected to first coil 902.

Figure 10:
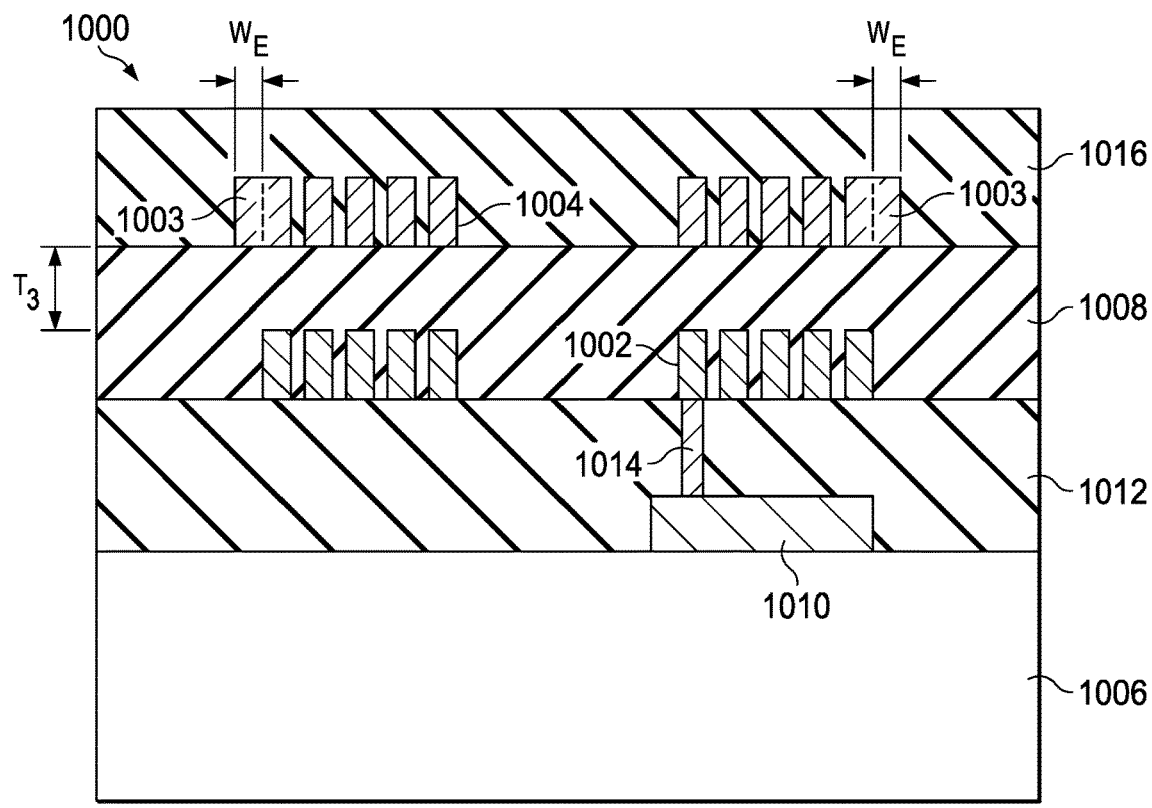
FIG. 10 is a view of example transformer that is perpendicular to the view of FIG. 9.

FIG. 10 is a view of example transformer 1000 that is perpendicular to the view of FIG. 9. Transformer 1000 is an example of transformer 900 (FIG. 9). In the example of transformer 1000, a first level metal 1010 is on a substrate 1006. In this example, substrate 1006 includes a top insulating layer, such as an oxide layer, on a crystalline semiconductor layer so that first level metal layer is on an insulating substrate. Also, in this example, first level metal 1010 is an aluminum layer with titanium nitride sticking layers on the surface that contacts substrate 1006 and on the opposite surface of first level metal 1010. In other examples, first level metal is copper, gold or another conductor. Photolithography patterns first level metal 1010. In this example, first interlevel dielectric 1012 is a plasma-enhanced chemical vapor deposited (PECVD) oxide layer formed over first level metal 1010 and substrate 1006. In other examples, first interlevel dielectric is other forms of silicon dioxide, such as tetraethyl orthosilicate (TEOS). Photolithography forms an opening in first interlevel dielectric 1012. In this example, a conductive material such as titanium, titanium nitride, tungsten or alloys thereof fills the opening to form via 1014. Other examples use other conductive materials. A second level metal deposited on first interlevel dielectric 1012 forms first coil 1002. Via 1014 contacts one end of first coil 1002 and first level metal 1010 provides a conductive connection from a bond pad (not shown) to via 1014. Another portion of first level metal 1010 and another via (not shown) provides contact to the other end of first coil 1002. In this example, first coil 1002 is aluminum with titanium nitride sticking layers on the surface where first coil 1002 contacts first interlevel dielectric 1012 and on the opposing surface of first coil 1002. In other examples, first coil 1002 is other conductive materials, such as copper.

In this example, second interlevel dielectric 1008 is PECVD oxide formed on first coil 1002 and first interlevel dielectric 1012. In other examples, second interlevel dielectric 1008 is other forms of silicon dioxide, such as TEOS, or other dielectric materials, such as silicon nitride. A third level metal patterned using photolithography forms second coil 1004 on second interlevel dielectric 1008. The third level metal includes bond pads (not shown) that provide connection to either end of second coil 1004. In this example, second coil 1004 is aluminum with titanium nitride sticking layers on the surface where second coil 1004 contacts second interlevel dielectric 1008 and on the opposing surface of second coil 1004. In other examples, second coil 1004 is other conductor materials, such as copper. The third level metal also include extensions 1003. As with the example of FIG. 7, $W_E$ is about 10% or more of the thickness $T_3$. Protective overcoat (PO) layer 1016 covers second coil 1004.

Figure 11:
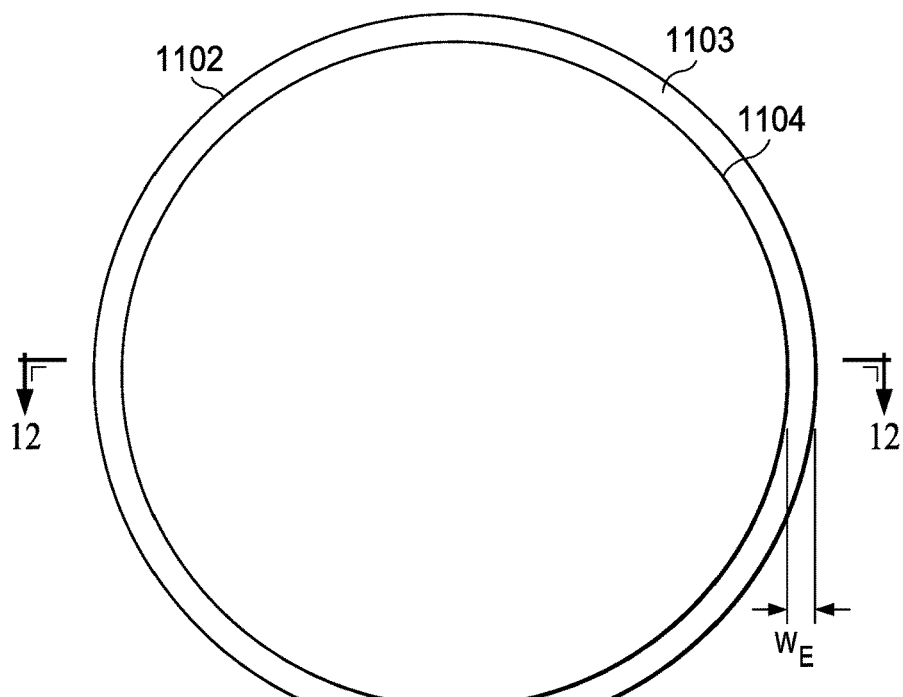
FIG. 11 is a view of an example capacitor.
Figure 12:
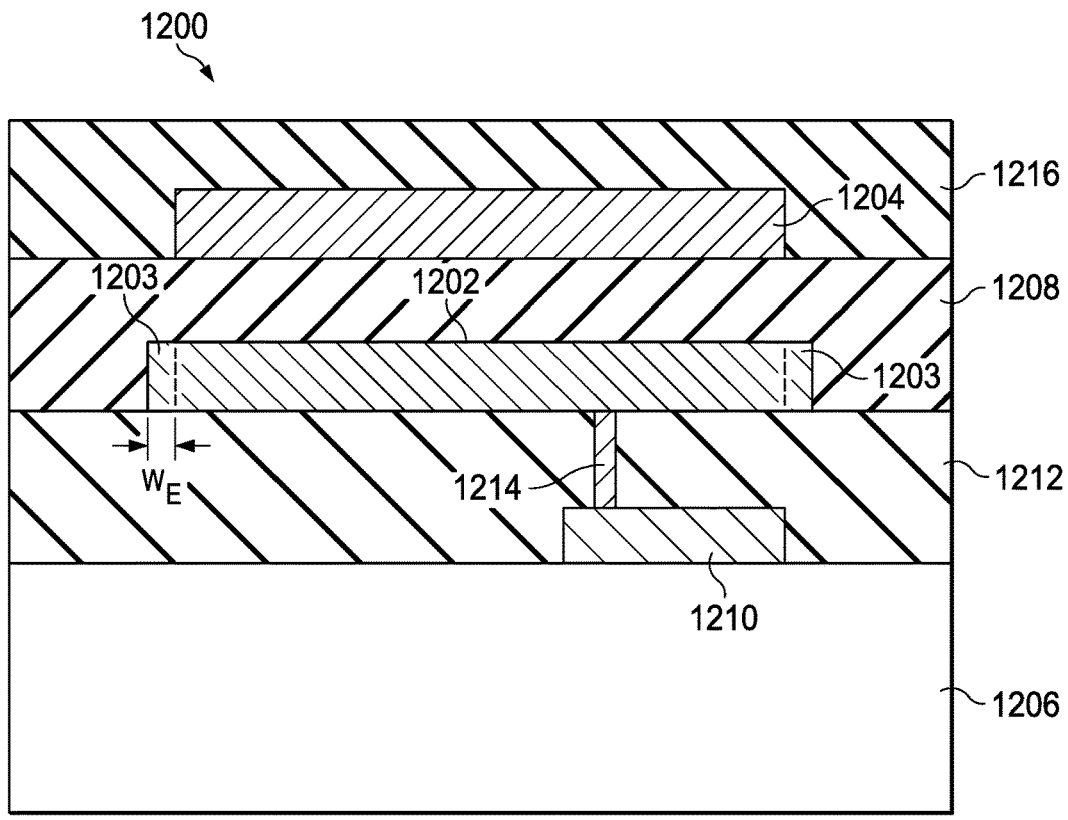
FIG. 12 is a view of example capacitor that is perpendicular to the view of FIG. 11.

FIG. 11 is a view of an example capacitor 1100. A second interlevel dielectric 1208 (FIG. 12) separates second plate 1104 from first plate 1102. First plate 1102 matches second plate 1104 except the outer periphery of first plate 1102 includes an extension 1103 with a width $W_E$ so that first plate 1102 is wider than second plate 1104. FIG. 12 is a view of example capacitor 1200 that is perpendicular to the view of FIG. 11. Capacitor 1200 is an example of capacitor 1100 (FIG. 11). Substrate 1206 is an example of substrate 706 (FIG. 7). First level metal 1210 is an example of first level metal 710 (FIG. 7). First interlevel dielectric 1212 is an example of first interlevel dielectric 712 (FIG. 7). Via 1214 is an example of via 714 (FIG. 7). Second interlevel dielectric 1208 is an example of second interlevel dielectric 708 (FIG. 7). Second plate 1204 is an example of second plate 1104 (FIG. 11). First plate 1202 is similar to second plate 1204 except that first plate 1202 includes extension 1203 on the outer periphery of first plate 1202. As with transformer 800 (FIG. 8), extension 1203 causes the any field applied to capacitor 1200 to spread at the periphery, thus mitigating the effects of high fields at the periphery of capacitor 1200. As with transformer 800 (FIG. 8), the width of the extension $W_E$ is about 10% or more of the thickness of second interlevel dielectric 1208 between first plate 1202 and second plate 1204. Protective overcoat (PO) layer 1216 covers second plate 1204.

Figure 13:
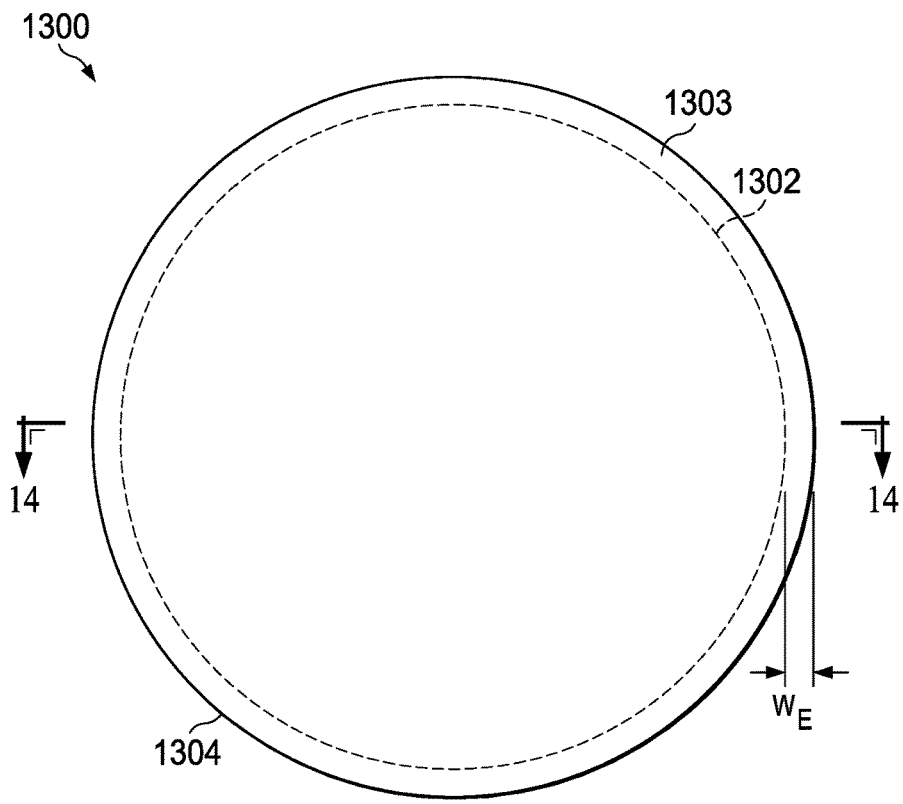
FIG. 13 is a view of an example capacitor.
Figure 14:
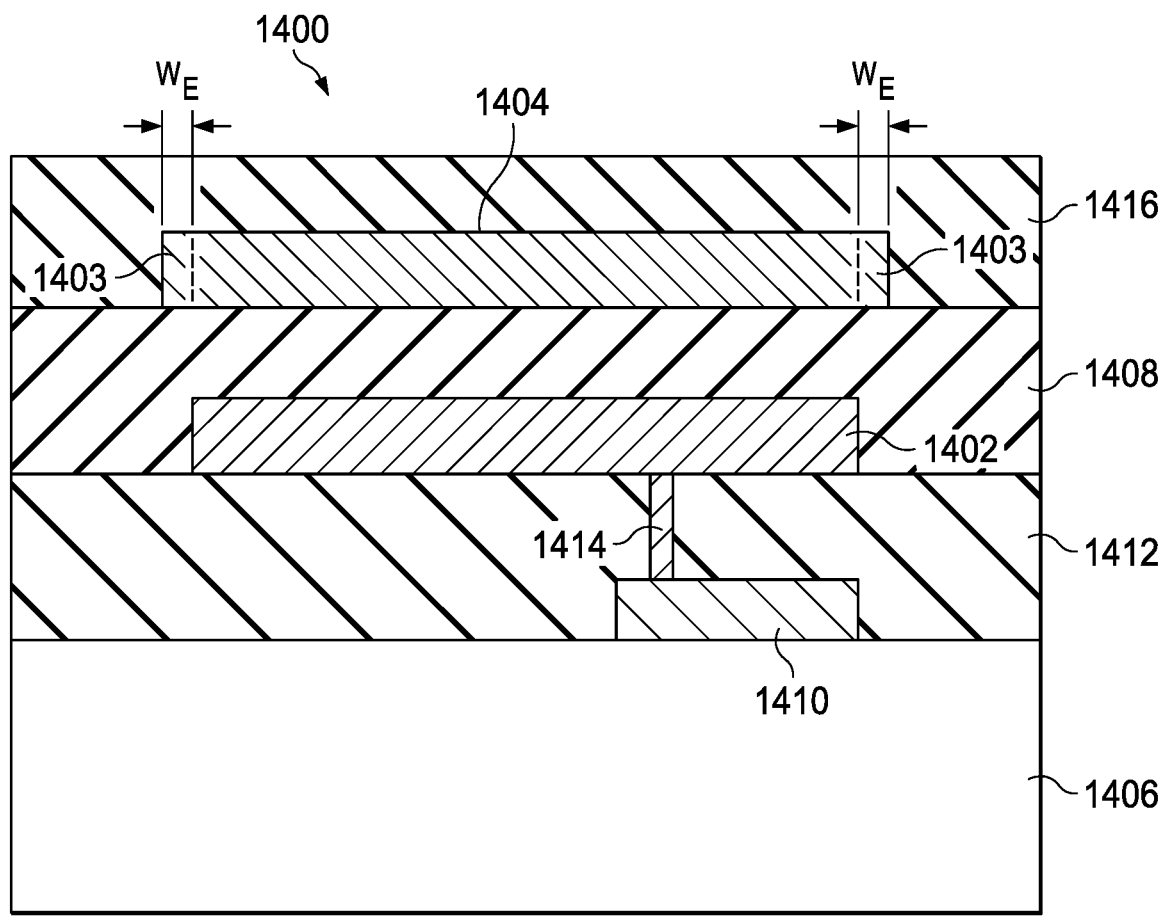
FIG. 14 is a view of example capacitor that is perpendicular to the view of FIG. 13.

FIG. 13 is a view of an example capacitor 1300. A second interlevel dielectric 1408 (FIG. 14) separates second plate 1304 from first plate 1302. First plate 1302 matches second plate 1304 except the outer periphery of second plate 1304 includes an extension 1303 with a width $W_E$ so that second plate 1302 is wider than second plate 1304. This is the reverse of capacitor 1100 (FIG. 11) where first plate 1102 (FIG. 11) includes extension 1103 (FIG. 11), and thus is wider than second plate 1104 (FIG. 11). FIG. 14 is a view of example capacitor 1400 that is perpendicular to the view of FIG. 13. Capacitor 1400 is an example of capacitor 1300 (FIG. 13). Substrate 1406 is an example of substrate 706 (FIG. 7). First level metal 1410 is an example of first level metal 710 (FIG. 7). First interlevel dielectric 1412 is an example of first interlevel dielectric 712 (FIG. 7). Via 1414 is an example of via 714 (FIG. 7). Second interlevel dielectric 1408 is an example of second interlevel dielectric 308 (FIG. 3). Second plate 1404 is an example of second plate 1304 (FIG. 13). First plate 1402 is similar to second plate 1404 except that second plate 1404 includes extension 1403 on the outer periphery of second plate 1404. As with transformer 800 (FIG. 8), extension 1403 causes the any field applied to capacitor 1400 to spread at the periphery, thus mitigating the effects of high fields at the periphery of capacitor 1400. As with transformer 800 (FIG. 8), the width of the extension $W_E$ is about 10% or more of the thickness of second interlevel dielectric 1408 between first plate 1402 and second plate 1404. Protective overcoat (PO) layer 1416 covers second plate 1404.

Figure 15:
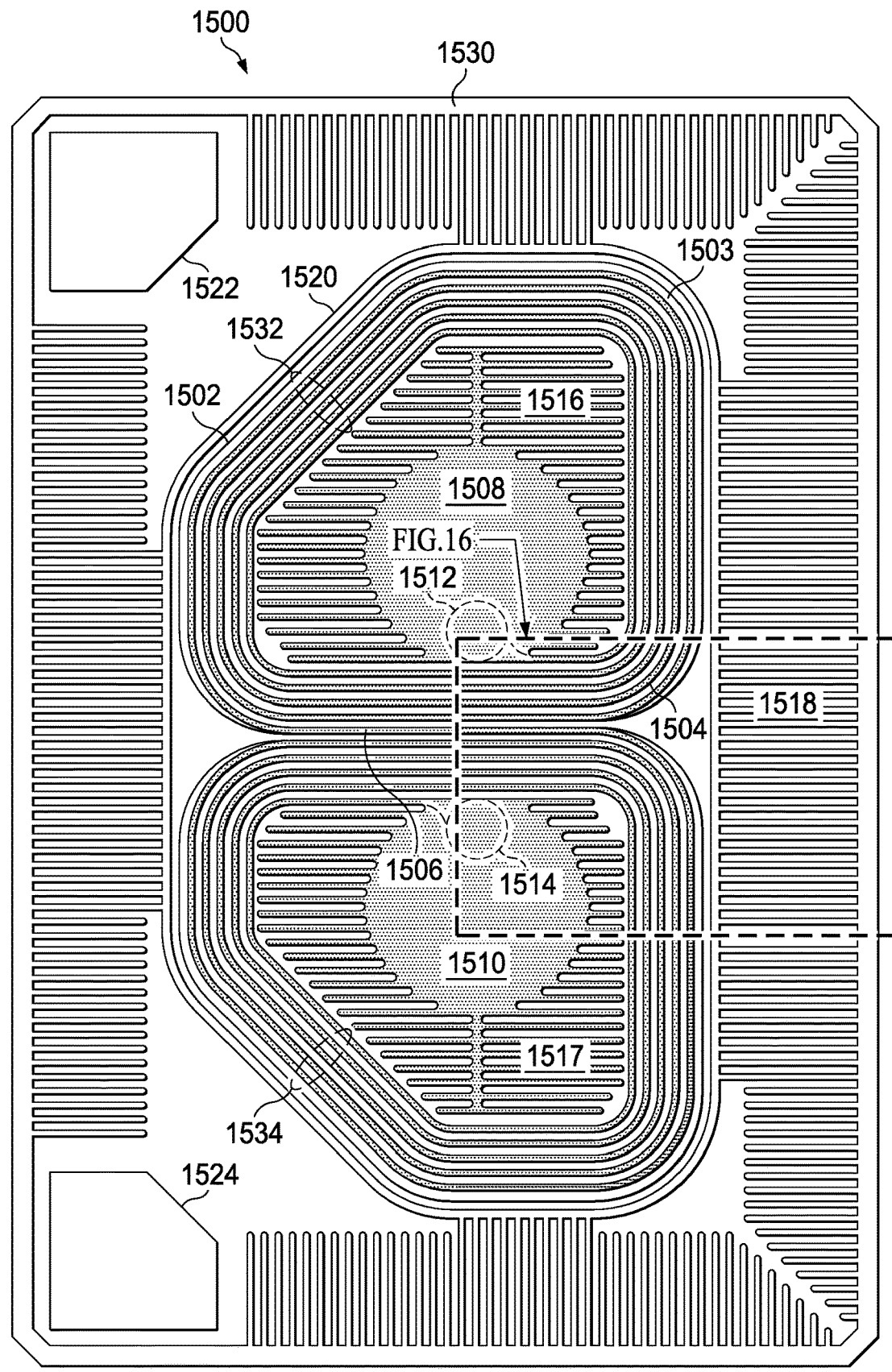
FIG. 15 is an example transformer.

FIG. 15 is an example transformer 1500. In the example of transformer 1500, substrate 1530 is a separate substrate from the substrates of the circuits coupled to transformer 1500. In an example, transformer 1500 is packaged in a hybrid package with the devices coupled to it. For example, with example circuit 100, transformer 1500 is an example of transformer 106 (FIG. 1) and is packaged in a hybrid package with first circuit 102 (FIG. 1) and second circuit 104 (FIG. 1). In other examples, transformer 1500 is formed on the same substrate as either first circuit 102 (FIG. 1) or second circuit 104 (FIG. 1). In another example, transformer 1500, first circuit 102 (FIG. 1), and second circuit 104 (FIG. 1) are formed in the same substrate. However, when devices are designed for harsh environments, a hybrid package with separate substrates provides additional isolation between components and thus more durability.

Second coil 1504 and first coil 1502 are formed in a figure eight configuration in part to maximize the number of loops of the transformer and in part to cancel some noise. First loop 1532 and second loop 1534 turn counterclockwise from first bond pad 1508 and second bond pad 1510, respectively. However, in a circuit, first bond pad 1508 couples to one terminal and second bond pad couples to an opposing terminal. First loop 1532 and second loop 1534 couple at crossover 1506. Therefore, first loop 1532 and second loop 1534 are oppositely coupled in the circuit. Any stray magnetic field that induces current in first loop 1532 will cause an opposing current in second loop 1534. These two currents will tend to cancel each other, thus canceling some extraneous noise the stray magnetic field may have caused.

Second coil 1504 and first coil 1502 both include first loop 1532 and second loop 1534. Similar to second coil 704 (FIG. 7) and first coil 702 (FIG. 7), second coil 1504 and first coil 1502 are separated by a dielectric of approximately 18.5 μm. One end of second coil 1504 couples to first bond pad 1508. The other end of second coil 1504 couples to second bond pad 1510. One end of first coil 1502 couples to first via pad 1512. First via pad 1512 couples by a via similar to via 714 (FIG. 7) and a first level metal layer similar to first level metal 710 (FIG. 7) to third bond pad 1522. The other end of first coil 1502 couples to second via pad 1514. Second via pad 1514 couples by a via similar to via 714 (FIG. 7) and a first level metal layer similar to first level metal 710 (FIG. 7) to fourth bond pad 1524.

Extension 1503 extends from first coil 1502 on the outer loops of both first loop 1532 and second loop 1534. Similar to transformer 800 (FIG. 8), extension 1503 helps spread electric fields applied to second coil 1504 and first coil 1502 to at the periphery to mitigate any damage that these fields may cause to the dielectric between second coil 1504 and first coil 1502. Shielding 1518 is a series of conductors around the periphery of transformer 1500. In this example, shielding 1518 is formed from a second level metal, such as the second level metal from which first coil 1502 is formed. Shielding 1518 is coupled to guard ring 1520. Together, these components reduce the effects of unwanted fields and help dissipate heat. First bond pad 1508 is coupled to first metallic fins 1516, which help dissipate heat and provide electro-magnetic shielding. Second bond pad 1510 is coupled to second metallic fins 1517, which also help dissipate heat and provide electro-magnetic shielding.

Figure 16:
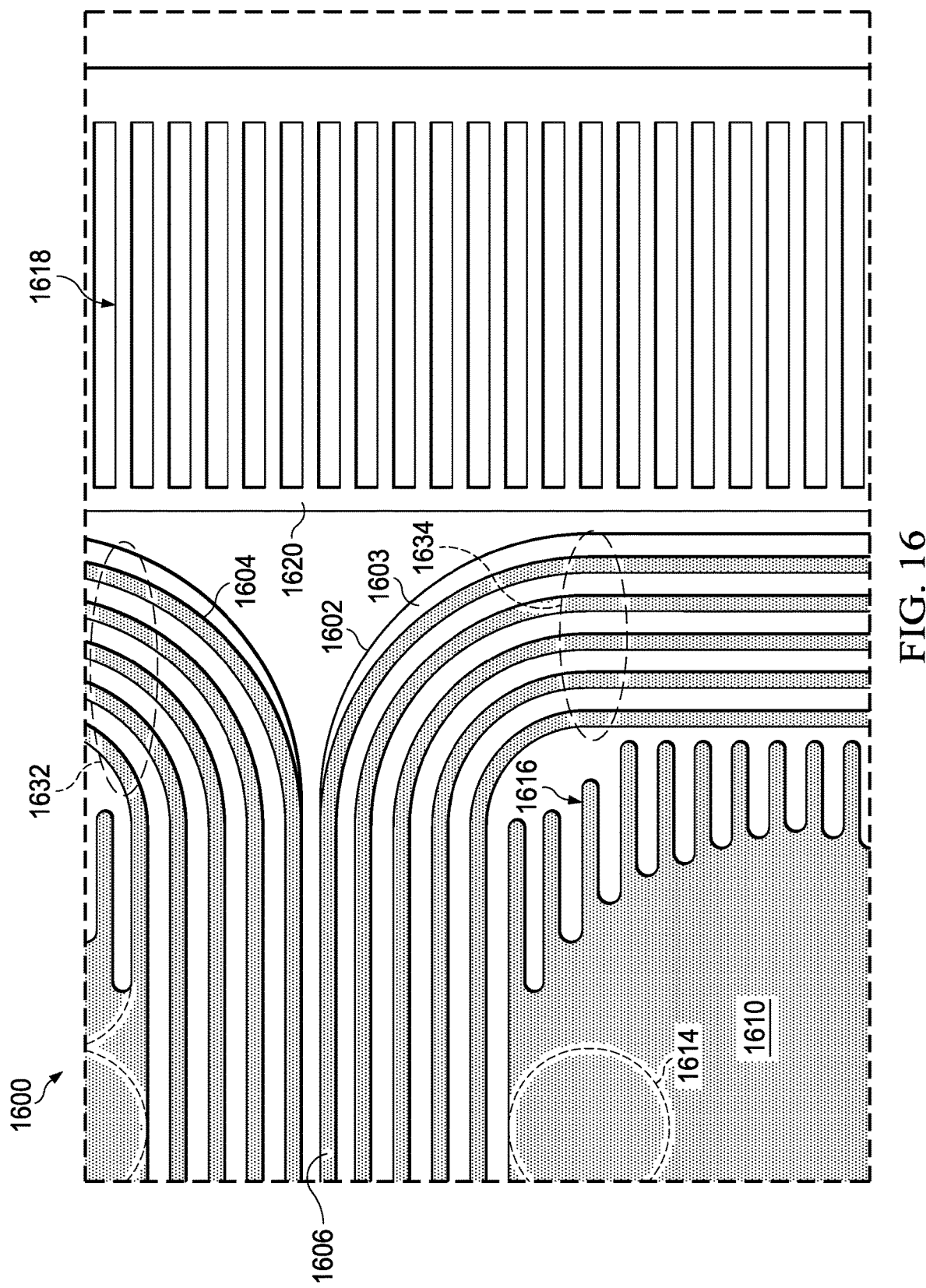
FIG. 16 is a detailed view of a transformer.

FIG. 16 is a detailed view of a transformer 1600. Transformer 1600 is an example of transformer 1500 (FIG. 15). Second coil 1604 is an example of second coil 1504 (FIG. 15). First coil 1602 is an example of first coil 1502 (FIG. 15). Shielding 1618 is an example of shielding 1518 (FIG. 15). Guard ring 1620 is an example of guard ring 1520 (FIG. 15). Bond pad 1610 is an example of bond pad 1510 (FIG. 15). Metallic fins 1616 are an example of first metallic fins 1516 (FIG. 15). Extension 1603 is an example of extension 1503 (FIG. 15). Second via pad 1614 is an example of second via pad 1514 (FIG. 15). As shown in FIG. 16, extension 1603 tapers away as the peripheral loop of loop 1632 curves toward crossover 1606. In addition, extension 1603 tapers away as the peripheral loop of loop 1634 becomes crossover 1606.

Figure 17:
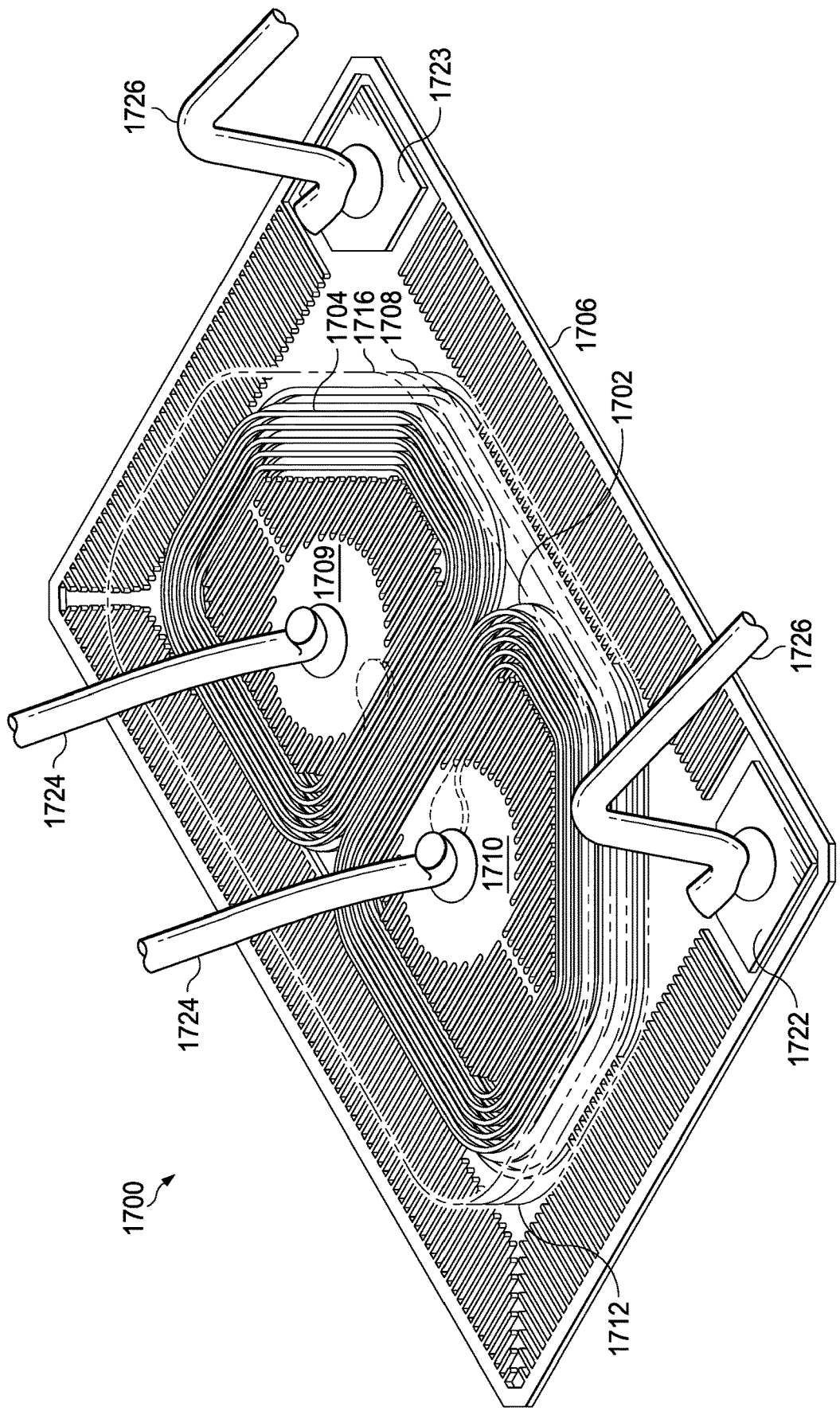
FIG. 17 is a perspective view of an example transformer.

FIG. 17 is a perspective view of an example transformer 1700. Example transformer is an example of transformer 700 (FIG. 7) and transformer 1500 (FIG. 15). Substrate 1706 is an example of substrate 706 (FIG. 7). Second coil 1704 is an example of second coil 1504 (FIG. 15). First coil 1702 is an example of first coil 1502 (FIG. 15). First interlevel dielectric 1712 is an example of first interlevel dielectric 712 (FIG. 7). Second interlevel dielectric 1708 is an example of second interlevel dielectric 708 (FIG. 7). Bond pad 1709 is an example of first bond pad 1508 (FIG. 15). Bond pad 1710 is an example of bond pad 1510 (FIG. 15). Third bond pad 1722 is example of third bond pad 1522 (FIG. 15). Fourth bond pad 1723 is an example of fourth bond pad 1524 (FIG. 15). Encapsulation layer 1716 is a dielectric layer that covers and protects first coil 1702. Bond wires 1724 bond to bond pad 1709 and bond pad 1710. In this example, bond wires 1724 couple to a first circuit in a hybrid package, such as first circuit 102 (FIG. 1). Bond wires 1726 bond to third bond pad 1722 and fourth bond pad 1723. In this example, bond wires 1726 couple to a second circuit in a hybrid package, such as second circuit 104 (FIG. 1).

Figure 18:
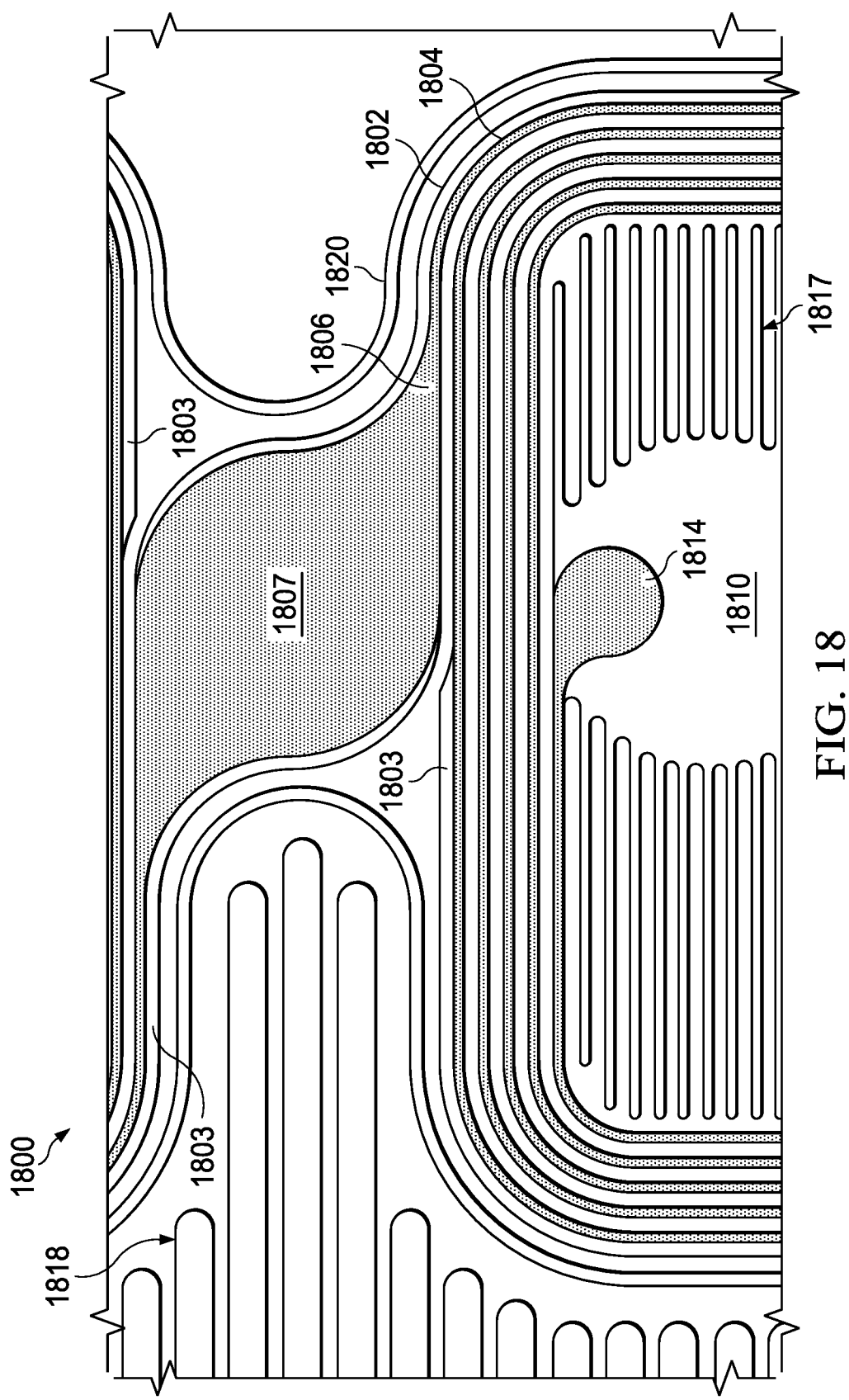
FIG. 18 is a view of example transformer.

FIG. 18 is a view of example transformer 1800. Second coil 1804 is an example of second coil 1504 (FIG. 15). First coil 1802 is an example of first coil 1502 (FIG. 15). Guard ring 1820 is an example of guard ring 1520 (FIG. 15). Second via pad 1814 is an example of second via pad 1514 (FIG. 15). Second bond pad 1810 and second metallic fins 1817 are examples of second bond pad 1510 (FIG. 15) and second metallic fins 1517 (FIG. 15), respectively. Shielding 1818 is an example of shielding 1518 (FIG. 15). Crossover 1806 is similar to crossover 1506 (FIG. 15). However, crossover 1806 includes center-tap bond pad 1807, which allows for transformer 1800 to use a center tap configuration. First coil 1802 includes a similarly configured area proximate to center-tap bond pad 1807 and a via (not shown) from first level metal allows for a center tap contact to first coil 1802. In this example, extension 1803 is similar to extension 1503 (FIG. 15). However, extension 1803 is on both sides of center-tap bond pad 1807 and only tapers away when one portion of first coil 1802 is close to another portion of first coil 1802. Stated another way, extension 1803 is only on the peripheral portions of first coil 1802.

Figure 19:
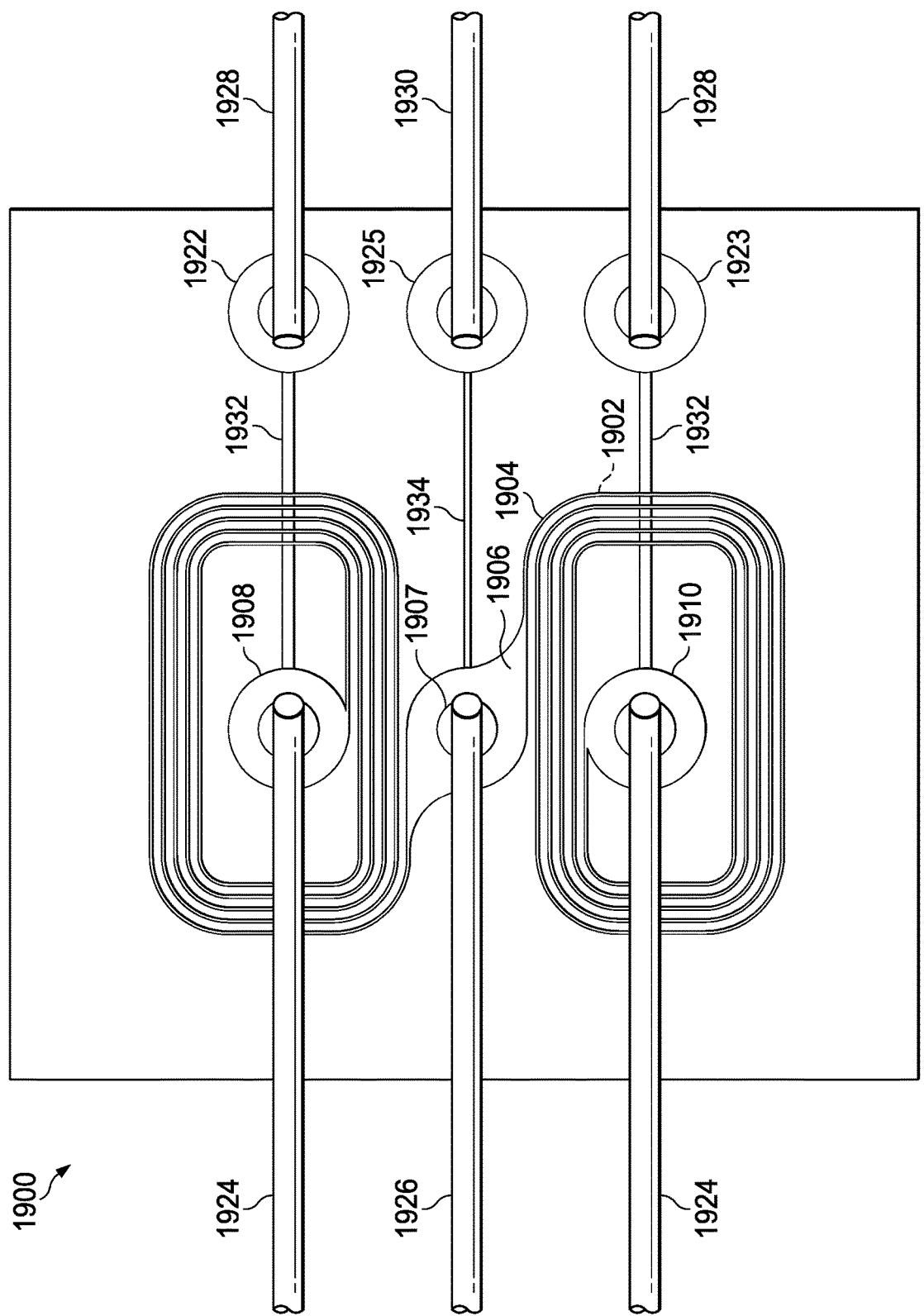
FIG. 19 is a view of an example transformer.

FIG. 19 is a view of an example transformer 1900. Transformer 1900 is an example of transformer 1800 (FIG. 18). Crossover 1906 is an example of crossover 1806 (FIG. 18). Second coil 1904 is an example of second coil 1804 (FIG. 18). First coil 1902 is an example of first coil 1802 (FIG. 18). Transformer 1900 couples in a center tap configuration. First bond wires 1924 couple to first bond pad 1908 and second bond pad 1910. First bond pad 1908 is an example of bond pad 1508 (FIG. 15). Second bond pad 1910 is an example of second bond pad 1810 (FIG. 18). Thus, first bond wires 1924 couple to either end of second coil 1904. Second bond wire 1926 couples to fifth bond pad 1907. Fifth bond pad 1907 is an example of center-tap bond pad 1807 (FIG. 18). Crossover 1906 is an example of crossover 1806 (FIG. 18). Thus, second bond wire 1926 couples to crossover 1906 and provides a center tap to second coil 1904.

First leads 1932 are first metal leads like first level metal 710 (FIG. 7) and couple the ends of first coil 1902 to third bond pad 1922 and fourth bond pad 1923. Third bond pad 1922 couples to one of third bond wires 1928, which, in this example, couples to another circuit in a hybrid package. Second lead 1934 is a first metal lead that couples the crossover area of first coil 1902. Second lead 1934 couples to sixth bond pad 1925. Fourth bond wire 1930 couples to fourth bond pad 1923. Thus, fourth bond wire 1930 couples to a center tap of first coil 1902. Not shown in this view is an extension from first coil 1902 that is an example of extension 1803 (FIG. 18). Thus, transformer 1900 allows for a configuration where both second coil 1904 and first coil 1902 include center tap connections.

Figure 20:
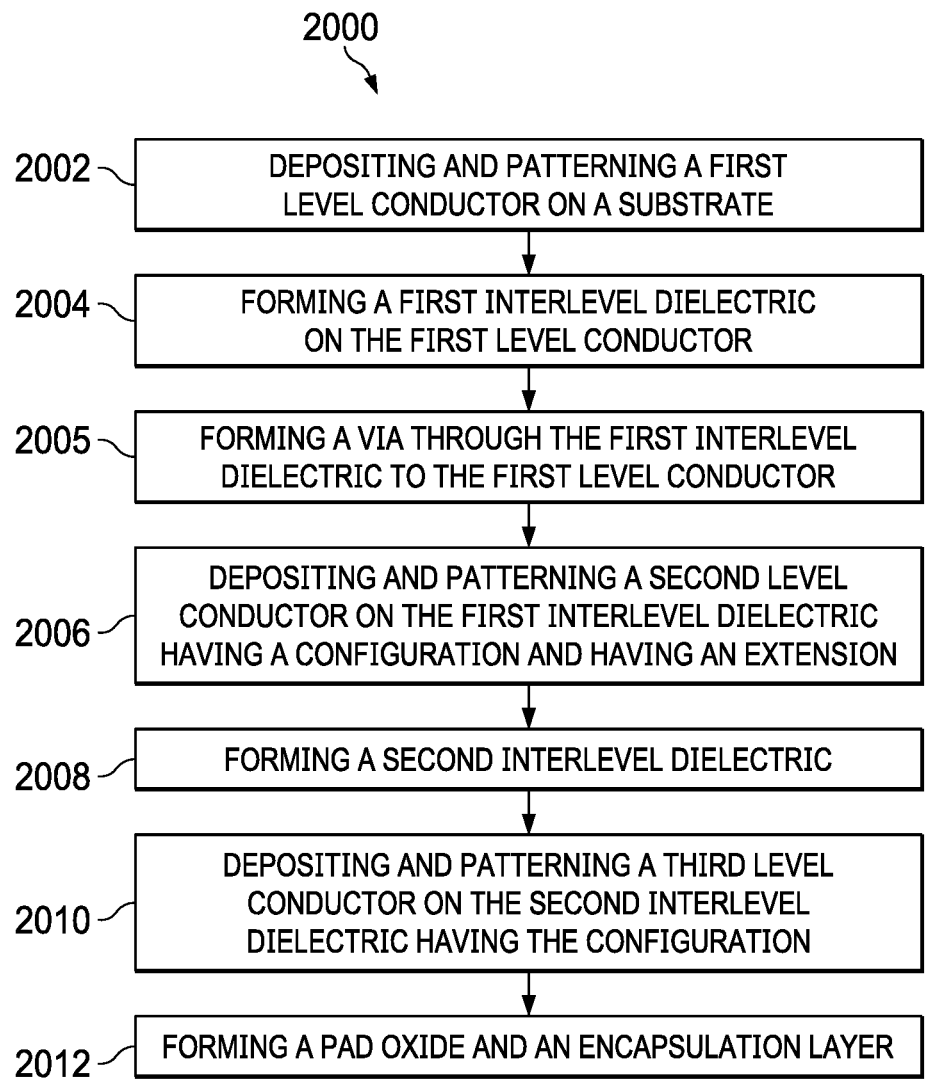
FIG. 20 is a flow diagram of an example process.
Figure 21A:
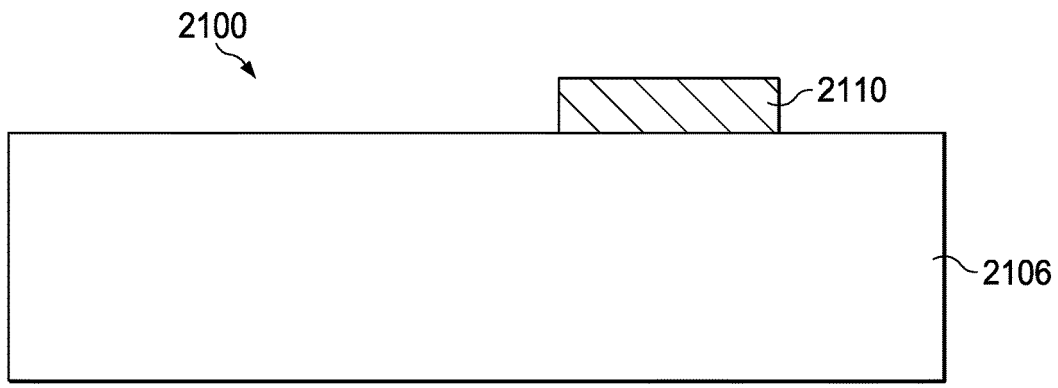
FIGS. 21A-21F (collectively "FIG. 21") are diagrams illustrating the steps of the process of FIG. 20.

FIG. 20 is a flow diagram of an example process 2000. FIGS. 21A-21F (collectively "FIG. 21") are diagrams illustrating the steps of process 2000. Step 2002 is depositing and patterning a first level conductor on a substrate. First level metal 2110 is formed on substrate 2106 as shown in FIG. 21A. In this example, substrate 2106 is an insulating layer, such as an oxide on a crystalline silicon substrate. In other examples, substrate 2106 is other materials such as polyimide. In the example where transformer 2100 is a separate component from coupled circuitry in a hybrid package, no active devices are formed in substrate 2106, which allows for a wide range of substrate materials. In this example, first level metal 2110 is an aluminum/copper alloy with titanium nitride sticking layers at the interface with substrate 2106 and on the opposite face of first level metal 2110 from substrate 2106. In addition to providing improved adhesion for first level metal 2110, a titanium nitride sticking layer has antireflective properties that improve the quality of photolithography. In this example, first level metal 2110 is approximately 3 μm thick. In other examples, first level metal 2110 is formed of other conductive materials, such as copper, gold, other conductive metals, or doped polycrystalline silicon. First level metal 2110 is an example of first level metal 710 (FIG. 7). Substrate 2106 is an example of substrate 706 (FIG. 7).

Figure 21B:
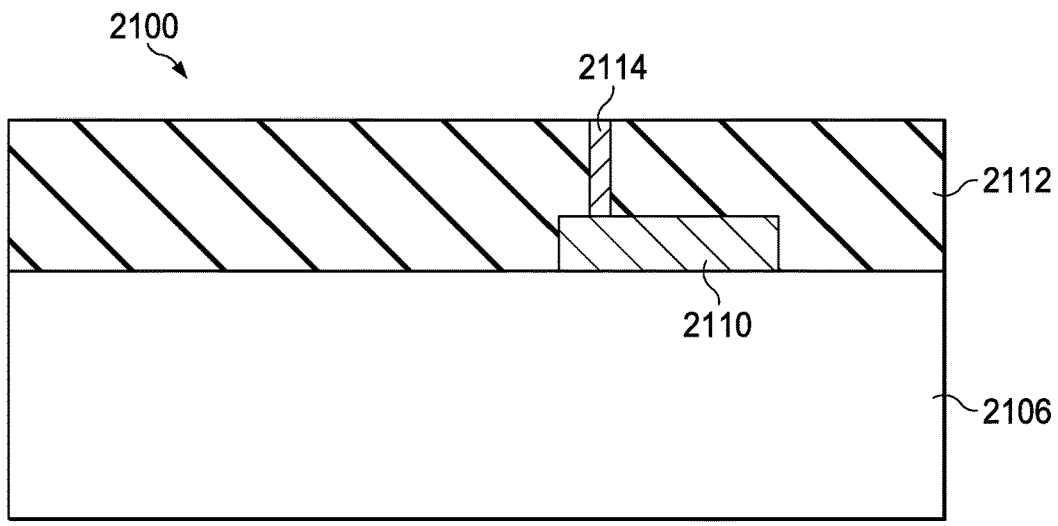

Step 2004 is forming a first interlevel dielectric. Step 2005 is forming a via through the first interlevel dielectric to the first level metal. First interlevel dielectric 2112 is formed on the surfaces of substrate 2106 and first level metal 2110 as shown in FIG. 21B. In this example, first interlevel dielectric 2112 is PECVD oxide formed to a thickness of approximately 0.5-1 μm. FFAn opening is formed in first interlevel dielectric using photolithography that is then filled with a conductive material such as titanium, titanium nitride, tungsten or alloys thereof to form via 2114. First interlevel dielectric 2112 is an example of first interlevel dielectric 712 (FIG. 7). Via 2114 is an example of via 714 (FIG. 7).

Figure 21C:
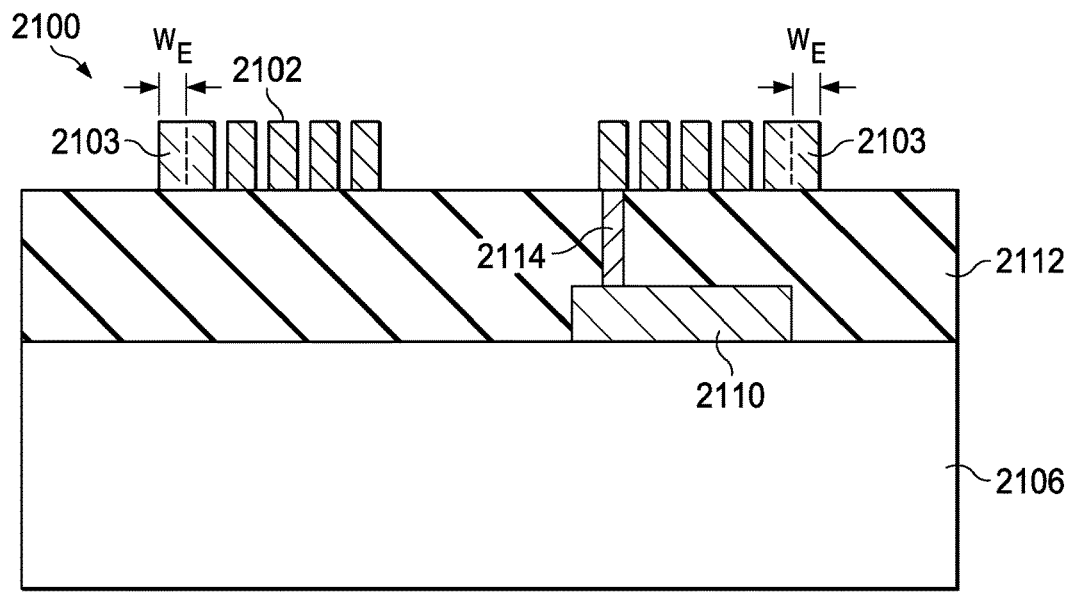

Step 2006 is depositing and patterning a second level conductor. A second level metal is deposited and patterned as first coil 2102 on first interlevel dielectric 2112 as shown in FIG. 21C. In this example, first coil 2102 is an aluminum/copper alloy with titanium nitride sticking layers at the interface with first interlevel dielectric 2112 and the opposite face of first coil 2102 from first interlevel dielectric 2112. In this example, first coil 2102 is approximately 3 μm thick. In other examples, first coil 2102 is formed of other conductive materials, such as copper, gold, other conductive metals, or doped polycrystalline silicon. First coil 2102 is an example of first coil 702 (FIG. 7). First coil 2102 includes extension 2103 in the peripheral loop of first coil 2102. In this example, the width $W_E$ of extension 2103 is approximately 2-6 μm. Extension 2103 is an example of extension 703 (FIG. 7).

Figure 21D:
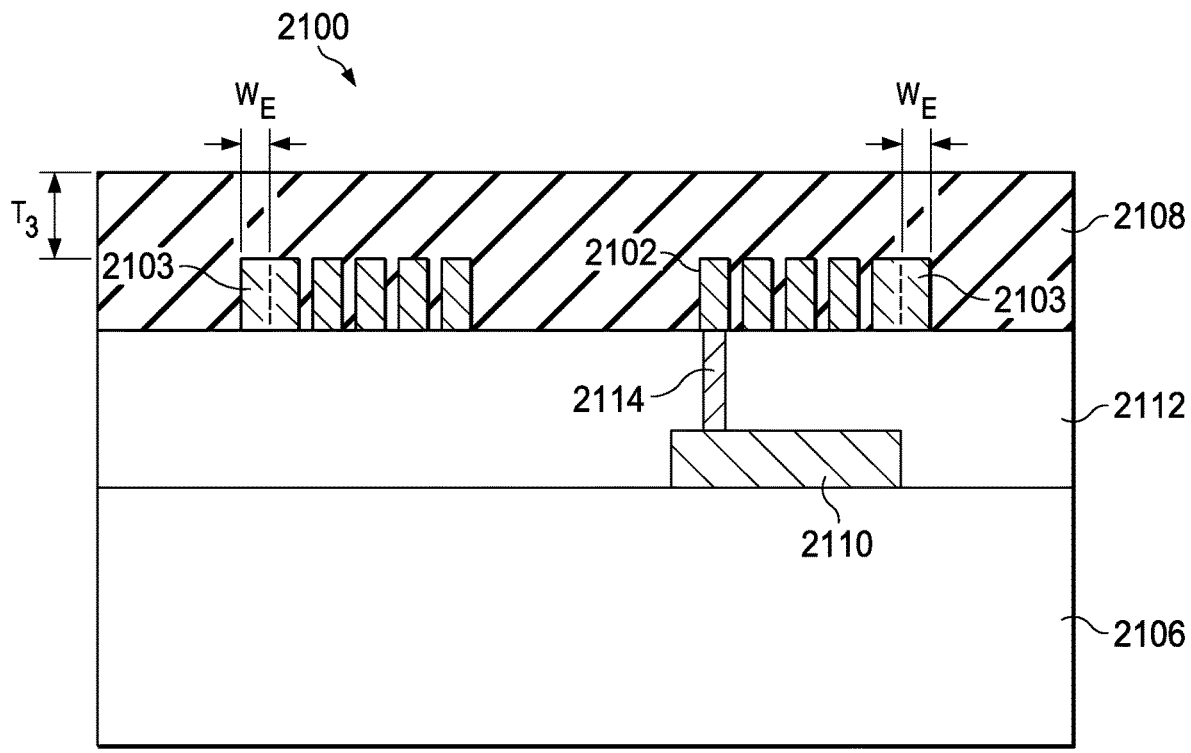

Step 2008 is forming a second interlevel dielectric. Second interlevel dielectric 2108 is formed on the surfaces of first interlevel dielectric 2112 and first coil 2102 as shown in FIG. 21D. In this example, second interlevel dielectric 2108 is PECVD oxide formed to a thickness of approximately 21.5 μm. In other examples, second interlevel dielectric 2108 is formed using a technique like chemical vapor deposition of a dielectric material such as silicon nitride. Second interlevel dielectric 2108 provides the dielectric between the coils. Therefore, second level dielectric is a material capable of withstanding high fields while providing good coupling between the coils. Examples of such materials is aluminum oxide, silicon nitride and silicon dioxide. In this example, second interlevel dielectric 2108 is approximately 21.5 µm thick. Thus, the portion of second interlevel dielectric 2108 on first coil 2102 is $T_3$, which is approximately 18.5 µm thick. In other examples, second interlevel dielectric is from 5-30 µm thick. In an example, $W_E$ is at least 10-20% of $T_3$. Second interlevel dielectric 2108 is an example of second interlevel dielectric 708 (FIG. 7).

Figure 21E:
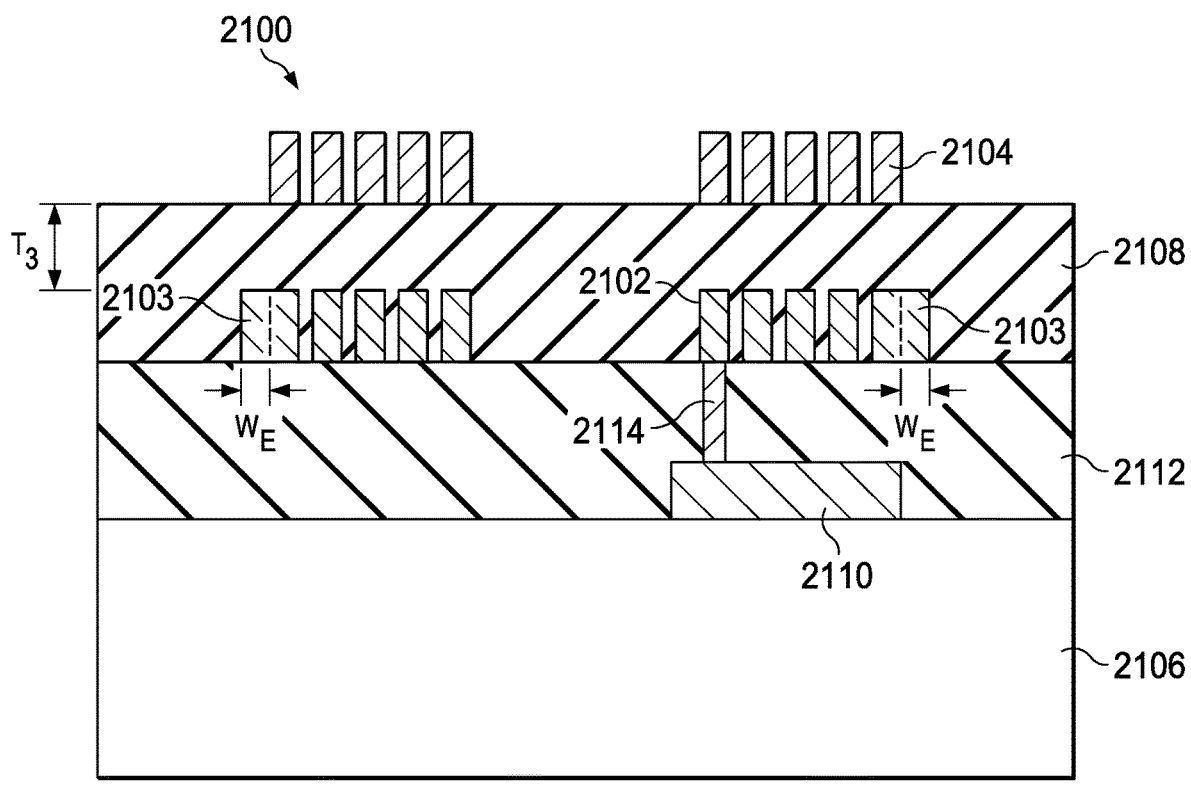

Step 2010 is depositing and patterning a third level metal. A third level metal is deposited and patterned using photolithography as second coil 2104 on second interlevel dielectric 2108 as shown in FIG. 21E. In this example, second coil 2104 is an aluminum/copper alloy with titanium nitride sticking layers at the interface with second interlevel dielectric 2108 and the opposite face of second coil 2104 from second interlevel dielectric 2108. In this example, second coil 2104 is approximately 3 µm thick. In other examples, second coil 2104 is 1-5 µm thick. In other examples, second coil 2104 is formed of other conductive materials, such as copper, gold, other conductive metals, or doped polycrystalline silicon. Second coil 2104 is an example of second coil 704 (FIG. 7).

Figure 21F:
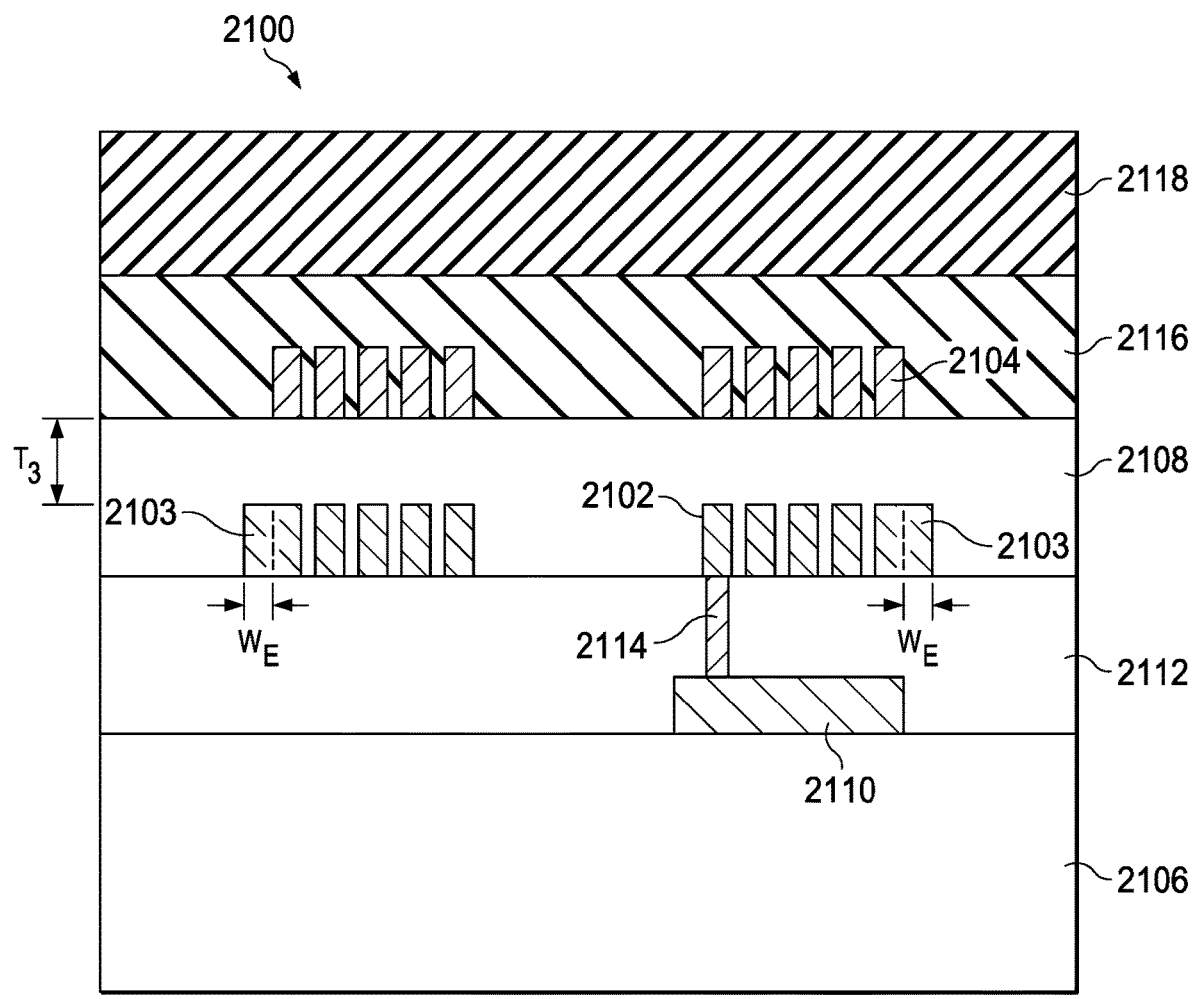

Step 2012 is forming a protective overcoat layer and an encapsulation layer. Protective overcoat layer 2116 and encapsulation layer 2118 are formed on second interlevel dielectric 2108 and second coil 2104 as shown in FIG. 21F. In this example, encapsulation layer 2118 is formed of deposited polyimide to a thickness of 10-100 µm thick. Openings (not shown) are formed in encapsulation layer 2118 and protective overcoat layer 2116 to expose bond pads, such as first bond pad 1709 (FIG. 17), second bond pad 1710 (FIG. 17), third bond pad 1722 (FIG. 17), and fourth bond pad 1723 to allow for bonding to the bond pads. Encapsulation layer 2116 is designed to protect underlying components from damage, such as by corrosion.

Modifications are possible in the described examples, and other examples are possible, within the scope of the claims.

What is claimed is:

1. A hybrid circuit comprising:
   a component, the component including:
   a first conductive element on a substrate having a configuration, having a first periphery, and having inner loops and an outer loop, the outer loop having an extension at the first periphery such that a width of the outer coil is greater than a width of each of the inner coils;
   a dielectric on the first conductive element; and
   a second conductive element having the configuration on the dielectric that is proximate to and aligned with the first conductive element, and having a second periphery, the extension of the outer coil extending past the second periphery.

2. The hybrid circuit of claim 1, wherein the component is a transformer.

3. The hybrid circuit of claim 1, wherein the extension extends beyond the second periphery by at least 10% of a thickness of the dielectric.

4. The hybrid circuit of claim 1, wherein the extension surrounds the first conductive element except where the first conductive element is adjacent to another part of the first conductive element.

5. A circuit comprising:
   an inductor on a first substrate, the inductor including:
   a first coil having a configuration and a first periphery, the first coil having inner loops and an outer loop, the outer loop having an extension at the first periphery;
   a second coil having the configuration that is aligned with the first coil, and having a second periphery, the second coil having inner loops and an outer loop, the outer loop of the first coil being wider than the outer loop of the second coil and the extension of the outer loop of the first coil extending past the second periphery; and
   a dielectric between the first coil and the second coil.

6. The circuit of claim 5, wherein the second coil is over the first coil.

7. The circuit of claim 5, wherein the first coil is over the second coil.

8. The circuit of claim 5, wherein the extension extends beyond the second periphery by at least 10% of a thickness of the dielectric.

9. The circuit of claim 5, further comprising:
   a first circuit on a second substrate coupled to first coil of the inductor; and
   a second circuit on a third substrate coupled to the second coil of the inductor.

10. The circuit of claim 5, wherein the first coil and the second coil comprise metal.

11. The first of claim 5, wherein:
    the first coil is connected to first and second bond pads at a first level, the first and second bond pads being located spaced from the dielectric; and
    the second coil is connected to third and fourth bond pads at a second level, the third and fourth band pads being located over the dielectric.

12. The circuit of claim 1 further comprising:
    a first circuit on a second substrate coupled to the first conductive element; and
    a second circuit on a third substrate coupled to the second conductive element.

13. The circuit of claim 1, wherein the first conductive element and the second conductive element comprise metal.

14. The first of claim 1, wherein:
    the first conductive element is connected to first and second bond pads at a first level, the first and second bond pads being located spaced from the dielectric; and
    the second conductive element is connected to third and fourth bond pads at a second level, the third and fourth band pads being located over the dielectric.

* * * * *